June 1, 1965 T. G. MARSHALL, JR 3,187,266

IMPEDANCE INVERTER COUPLED NEGATIVE RESISTANCE AMPLIFIERS

Filed Sept. 12, 1960

INVENTOR.
THOMAS G. MARSHALL, JR.
BY Eugene M. Whitacre
Attorney 3,187,266
Patented June 1, 1965

3,187,266

IMPEDANCE INVERTER COUPLED NEGATIVE RESISTANCE AMPLIFIERS

Thomas G. Marshall, Jr., Skillman, N.J., assignor to Radio Corporation of America, a corporation of Delaware Filed Sept. 12, 1960, Ser. No. 55,554
7 Claims. (Cl. 330—34)

This invention relates generally to electrical signal translating circuits, and more particularly to amplifiers using a plurality of negative resistance devices.

Amplifiers employing a single negative resistance active circuit element, such as a tunnel diode, have heretofore been disclosed for providing relatively high amplification of a high frequency intelligence signal. One of the major problems encountered in the design and operation of such amplifiers is that of maintaining a substantially constant gain in the presence of changes in the magnitude of the negative resistance of the diode resulting from variations in external influences such as bias potential and ambient temperature. It has been found that slight changes in the negative resistance cause a relatively large variation in the gain of the amplifier.

Another major problem encountered in the prior art is the extreme difficulty of attaining concurrent matching of the amplifier circuit to both the source and load impedances by reason of which undesirable signal reflections occur in the circuit which tends to cause signal distortion such, for example, as echoes in voice transmission applications or ghosts in picture transmission applications. This impedance matching incapability of the prior art amplifiers also resulted in poor noise performance and a critical dependence of gain upon the values of the source and load impedances.

Accordingly, it is an object of the present invention to provide an improved negative resistance signal translating circuit.

Another object of the instant invention is to provide an improved negative resistance amplifier circuit exhibiting a substantially constant high gain.

Still another object of this invention is to provide an improved negative resistance diode amplifier exhibiting gain substantially independent of source and load impedance variations.

A further object of the invention is to provide an improved relatively simple circuit arrangement for coupling a plurality of negative resistance active circuit elements in an amplifier circuit.

A still further object of the present invention is to provide an improved tunnel diode amplifier circuit having gain substantially independent of variations in the negative resistance element.

Another still further object of the instant invention is to provide an improved negative resistance amplifier capable of concurrently matching the impedance of the source and load connected thereto.

Still another further object of this invention is to provide an improved negative resistance amplifier circuit exhibiting a low noise transmission characteristic.

These and other objects are attained by an amplifier according to the invention having a plurality of semiconductor diode elements exhibiting a negative resistance region connected across an input circuit and an output circuit. A common biasing supply is provided for forward biasing the diode elements for operation at a desired point on the negative slope of the current-voltage characteristic curve thereof. An impedance inversion device is included to effect impedance matching between the input and output circuits and the external circuits connected thereto thereby eliminating undesirable signal reflections. Also by suitable impedance inversion, the positive load impedances across the diode elements are reduced thereby improving the overall operational stability of the amplifier.

In general, an impedance inversion device can be defined as a two-port (four terminal) network which exhibits the electrical characteristics that when an impedance $Z_1$ is connected across port 1, an impedance which is equal to $R_0^2/Z_1$ appears across port 2 and similarly when an impedance $Z_2$ is connected across port 2, an impedance which is equal to $R_0^2/Z_2$ appears across port 1. $R_0$ is termed the inversion constant and depends on the particular impedance inversion device used. For example, in a transmission line, $R_0$ is the characteristic impedance of the transmission line.

The novel features that are considered to be characteristic of this invention are set forth with particularity in the appended claims. The invention itself, however, both as to its organization and method of operation as well as additional advantages thereof, will best be understood from the following detailed description when considered in connection with the accompanying drawing wherein:

Figure 1:
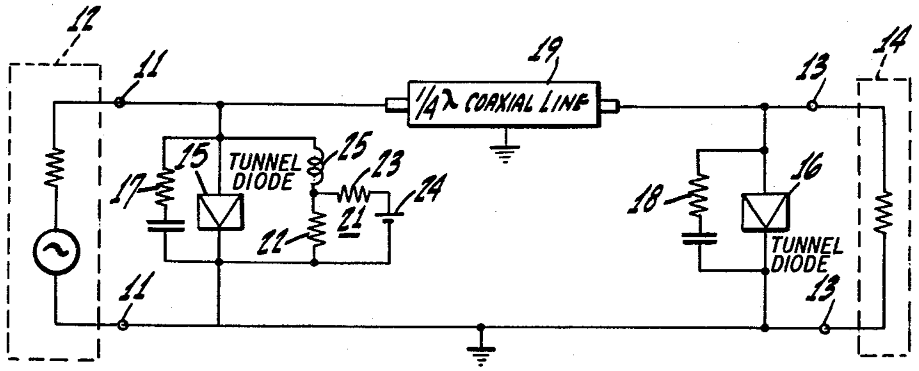
FIGURE 1 is a schematic circuit diagram of one embodiment of a negative resistance amplifier in accordance with the invention.

Referring now to the drawing wherein like reference numerals designate identical or corresponding parts throughout the several views, and particularly to FIGURE 1 wherein a negative resistance amplifier in accordance with one embodiment of the invention is shown as including input terminals 11 for connection to a suitable signal source 12 and output terminals 13 for connection to a suitable load impedance, or utilization device 14. The amplifier also includes a pair of negative resistance active circuit elements, such as tunnel diodes 15 and 16, which are respectively connected across input terminals 11 and output terminals 13. Resistance-capacitance networks 17 and 18 of conventional design are preferably connected in close physical contact with the electrodes of tunnel diodes 15 and 16, respectively, to stabilize the amplifier operation by insuring that high frequency oscillations are damped out. Such a network is described in the copending application of J. B. Schultz entitled Negative Resistance Amplifier, filed February 29, 1960, Serial Number 11,903, and assigned to the assignee of this application. A dissipationless impedance inverter device, such for example as an open ended quarter wave coaxial transmission line 19 having a predetermined characteristic impedance $R_0$, is connected between the corresponding electrodes of negative resistance diodes 15 and 16.

Since, as is well known, the impedance of a quarter wave transmission line 19 to direct current flow is negligible, suitable biasing potentials can be provided for both diodes by a single bias supply 21. The bias supply 21 is composed of a voltage divider consisting of resistors 22 and 23 serially connected across a unidirectional potential energy source, such as a battery 24. The potential across bias resistor 22 is impressed across the electrodes of both tunnel diodes through an inductance 25 which is designed to present an effective open circuit at the operating frequency range of the amplifier to the tunnel diodes 15 and 16. The potential across resistor 22 is of a magnitude to establish a single valued D.C. operating point for the diodes in the negative resistance region of their current-voltage characteristic. To insure stable operation of the negative resistance diodes, the D.C.

internal impedance of the bias supply is designed to be less than the absolute value of the negative resistance exhibited by the diodes.

Figure 2:
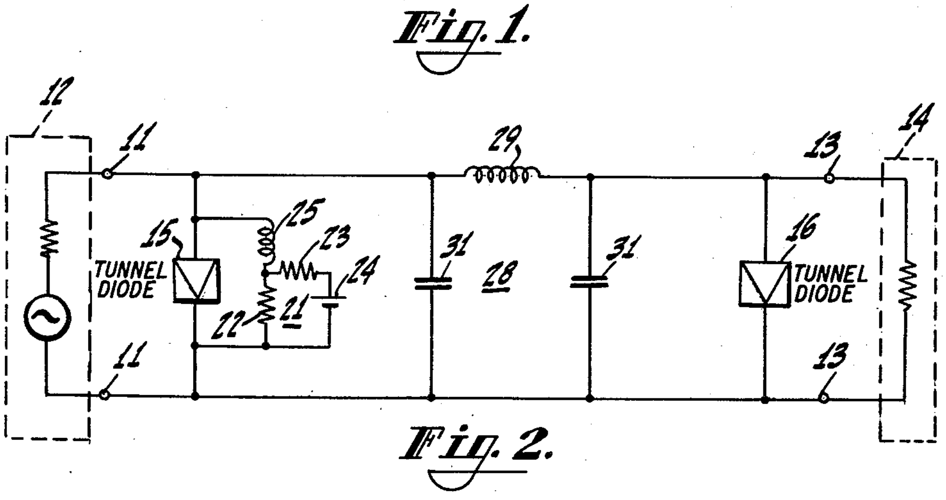
FIGURE 2 is a schematic circuit diagram of another embodiment of a negative resistance amplifier in accordance with the invention; and, FIGURE 3 is a simplified circuit diagram of the amplifiers shown in FIGURES 1 and 2 of the invention.

FIGURE 2 illustrates another embodiment of the negative resistance amplifier according to the invention especially suitable for use at somewhat lower frequencies at which the physical size of an impedance inverter having distributed constants, such as the transmission line 19 employed in the amplifier of FIGURE 1, becomes impractical. In this application, impedance inversion is suitably obtained by providing a dissipationless tuned network 28 having a predetermined impedance of inversion and composed of lumped constants, such as inductor 29 and capacitors 31, between the negative resistance diodes 15 and 16. Again, since the impedance of the inductor 29 to direct current flow is negligible, a single bias supply 21 is utilized to establish the D.C. operating level of both tunnel diodes. A complete discussion on the use of filter networks as impedance inverters is presented in an article entitled "The Elements of Nonreciprocal Microwave Devices" by C. L. Hogan, appearing in the Proceedings of the IRE, volume 44, page 1348, October 1956.

Figure 3:
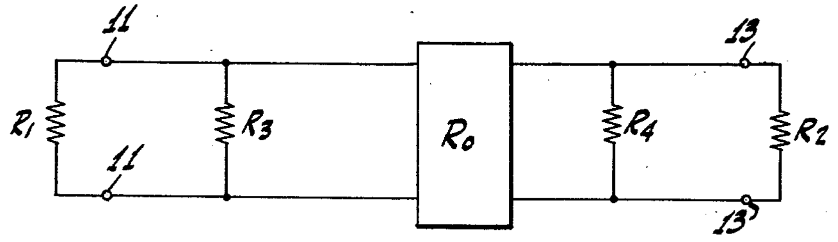

To facilitate an understanding of the manner in which the negative resistance amplifier circuit according to the present invention provides for improved operational immunity from negative resistance and source and load impedance variations, improved source and load impedance matching, and improved noise performance, reference will be made in the following discussion to the simplified A.C. circuit diagram thereof shown in FIGURE 3. In FIGURE 3, the positive resistances of source 12 and load 14 are respectively represented by resistors $R_1$ and $R_2$, while the negative resistances of tunnel diodes 15 and 16 are respectively represented by resistors $R_3$ and $R_4$. The impedance inverter is characterized by the inversion constant, $R_0$.

As is well known, signal reflections within a circuit are avoided when the resistance seen by a source and load are respectively equal to the resistances of the source and load. In the simplified circuit of FIGURE 3 this desirable condition is satisfied by selecting an impedance inverter having an inversion constant which inverts the relatively high equivalent resistance of the parallel combination of resistors $R_2$ and $R_4$ to a low resistance which in combination with $R_3$ presents a resistance at terminals 11 equal to that of resistor $R_1$, and concurrently, inverts the relatively high equivalent resistance of the parallel combination of resistors $R_1$ and $R_3$ to a low resistance which in combination with $R_4$ presents a resistance at terminals 13 equal to that of resistor $R_2$. By providing the aforedescribed impedance inversion the input and output resistances of the circuit essentially match the source and load impedances, respectively; hence, signal reflections at the source and load are avoided.

In a specific example the source and load impedances $R_1$ and $R_2$ are both 50 ohms. The tunnel diode resistors $R_3$ and $R_4$ are equal to $$\frac{-R_1}{\sqrt{1-\alpha}}$$

where $\alpha$ is a parameter satisfying the condition $0 \leq \alpha \leq 1$. $R_0$ or the characteristic impedance of the transmission line equals $$\frac{R_1}{\sqrt{\alpha}}$$

If $\alpha = 1/2$, $-R_0 = R_3 = R_4 = -70.7$ ohms.

The parallel combination of $R_2$ and $R_4$, 50 and $-70.7$ ohms respectively is about 170 ohms. Looking into the input terminals of the impedance inverter 19, one sees $$\frac{R_0^2}{170} \text{ or } \frac{70.7^2}{170}$$

or about 29 ohms. This resistance in parallel with the tunnel diode resistance $R_3$ results in a resistance of 50 ohms, or the resistance of source $R_1$.

The same calculations may be made from the source to the load, and results in matching the impedance of the load to the rest of the circuit.

It has heretofore been shown that low-noise amplification can be obtained with negative resistance amplifiers if the noise generated in the load impedance is not amplified and returned to the load. In circuits embodying the present invention, the ability to match the impedances of the source and the load circuits minimizes signal reflections and thus provides for low noise amplification. For a more complete discussion of low noise amplification in negative resistance amplifiers, reference can be made to an article entitled, "Proposal for a Maser-Amplifier System Without Nonreciprocal Elements" by S. H. Cutler in Proceedings of the IRE, vol. 46, pp. 1880–1881; November 1958 issue.

The circuit of FIGURE 3 can also be designed to render the gain thereof substantially immune to changes in the magnitudes of the negative resistances $R_3$ and $R_4$. To achieve this desirable result, the resistance of the parallel combination of resistances $R_2$, $R_4$ is made relatively high in order that by impedance inverter operation the circuit resistance shunting resistor $R_3$ is relatively low. Thus current flowing from the source $R_1$ into the impedance inverter will not be significantly changed by any variation in the magnitude of the negative resistance of $R_3$. Since the power output of the circuit is determined by this current, the transducer gain, itself, is substantially unaffected by changes in $R_3$. By similar reasoning, the transducer gain from the load to the source is substantially unaffected by changes in $R_4$. Because the circuit is reciprocal, this transducer gain and the transducer gain from source to load are equal. Thus the latter transducer gain is substantially independent of $R_4$ as well as $R_3$. Therefore, less critical circuit operation is obtained.

It is to be understood that although the invention has been particularly described using tunnel diodes as the negative resistances thereof, that the invention is in no way limited to these devices, and can utilize with equal advantage other negative resistances such as masers, time varying reactances (parametric amplifiers), negative impedance converter circuits, etc. Furthermore, for narrow band operation the impedance inverter employed in the circuit of the present invention can also be a waveguide, strip-line, sum-mode parametric amplifier or filter network with its open circuit impedances equal to zero, i.e., $Z_{11} = Z_{22} = 0$ as discussed in the hereinbefore referenced article by C. L. Hogan. If wide band operation of the circuit is desired, the impedance inverter can be a gyrator or an active network realization of a gyrator as described in an article entitled, "Some Gyrator and Impedance Inverter Circuits," by B. P. Bogert, appearing in Proceedings of the IRE, vol. 43, pp. 793–796, July 1955 issue.

Thus, a negative resistance amplifier is provided by the present invention having superior impedance matching capabilities, improved noise performance, and a gain characteristic less critical to variations in negative resistances and source and load impedances than the previously known negative resistance amplifiers.

What is claimed is:

1. A signal translating circuit comprising a pair of negative resistance devices, input circuit means for applying an input signal to said devices, output circuit means for deriving an output signal from said devices, and means coupled between said pair of devices for providing an impedance inversion.

2. A signal translating circuit comprising a pair of negative resistance devices, an input circuit connected to one of said devices for applying an input signal to said signal translating circuit, an output circuit connected to the other one of said devices for deriving an output signal from said signal translating circuit, and impedance inverter means connected between said input circuit and said output circuit.

3. An amplifier circuit comprising a pair of negative resistance circuits, input circuit means for applying an input signal to one of said negative resistance circuits, output circuit means for deriving an output signal from the other one of said negative resistance circuits, and impedance inverter means connected to said negative resistance circuits for effectively reducing the impedances presented to each of said resistance circuits.

4. A negative resistance amplifier circuit comprising a pair of negative resistance devices having a current-voltage characteristic curve including a portion of negative slope, means forward biasing said devices for conduction at a level corresponding to a point on said negative slope, input circuit means for applying an input signal to be amplified in said circuit to one of said pair of devices, output circuit means for deriving an amplified output signal from the other one of said pair of devices, and an impedance inversion device coupled between said input circuit means and said output circuit means.

5. A negative resistance amplifier circuit comprising a pair of negative resistance devices having a current-voltage characteristic curve including a portion of negative slope, means forward biasing said devices for conduction at a level corresponding to a point on said negative slope, input circuit means connected across one of said pair of devices, output circuit means connected across the other one of said pair of devices, impedance inverter means having input, output and common terminals, means coupling said one device across said input and common terminals, and means coupling said other device across said output and common terminals.

6. A negative resistance amplifier circuit comprising a pair of negative resistance devices having a current-voltage characteristic curve including a portion of negative slope, means forward biasing said devices for conduction at a level corresponding to a point on said negative slope, input circuit means connected across one of said pair of devices for applying a signal to be amplified to said circuit from a signal source, output circuit means connected across the other one of said pair of devices for deriving an amplified signal output from said circuit for application to a utilization device, and an impedance inverter comprising a quarter wave transmission line having a first pair of terminals connected across said input circuit means and a second pair of terminals connected across said output circuit means for effecting matching between the impedances presented by said amplifier circuit and the impedances of said signal source and said utilization device.

7. A signal translating circuit comprising:

first and second negative resistance devices, a signal source having an impedance $R_1$, a load impedance element having an impedance $R_2$, an impedance inverter having a characteristic impedance $R_0$ and having input, output and common terminals, means coupling said signal source and said first negative resistance device in parallel between said input and common terminals, means coupling said load impedance element and said second negative resistance devices in parallel between said output and common terminals, the impedance as measured between said input and common terminals of said impedance inverter being a function of the relationship $$\frac{R_0^2}{Z_t}$$

where $Z_t$ is the total impedance between said output and common electrodes, the values of $R_0$, $R_2$, and the negative resistance of the second negative resistance device being such that the impedance as measured between the input and common electrodes is of a value which when combined with the negative resistance of the first negative resistance device is substantially equal to the impedance of the signal source $R_1$, the impedance as measured between said output and common terminals being a function of the relationship $$\frac{R_0^2}{Z_s}$$

where $Z_s$ is the total impedance coupled between said input and common electrodes, the values of $R_0$, $R_1$ and the negative resistance of said first negative resistance device being such that the impedance as measured between the output and common electrodes are of values which when combined with the negative resistance of said second negative resistance device is substantially equal to the load impedance $R_2$.

References Cited by the Examiner

UNITED STATES PATENTS

| | | | |
|---|---|---|---|
| 2,775,658 | 12/56 | Mason et al. | 333—80 X |
| 2,788,496 | 4/57 | Linvill | 333—80 |
| 2,933,703 | 4/60 | Kinariwala | 333—80 |

OTHER REFERENCES

Article—Tunnel Diode Operation and Application, by I. Lesk et al., Electrical Engineering, April 1960, pages 270–277.

ROY LAKE, *Primary Examiner.*

BENNETT G. MILLER, JOHN KOMINSKI, *Examiners.*